US009805936B2

United States Patent
Nabeya et al.

(10) Patent No.: US 9,805,936 B2
(45) Date of Patent: *Oct. 31, 2017

(54) METHOD FOR PRODUCING NICKEL THIN FILM ON A SI SUBSTRATE BY CHEMICAL VAPOR DEPOSITION METHOD, AND METHOD FOR PRODUCING NI SILICIDE THIN FILM ON SI SUBSTRATE

(71) Applicant: Tanaka Kikinzoku Kogyo K.K., Chiyoda-ku, Tokyo (JP)

(72) Inventors: Shunichi Nabeya, Tsukuba (JP); Ryosuke Harada, Tsukuba (JP); Kazuharu Suzuki, Tsukuba (JP); Takayuki Sone, Tsukuba (JP); Michihiro Yokoo, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/025,345

(22) PCT Filed: Sep. 18, 2014

(86) PCT No.: PCT/JP2014/074628
§ 371 (c)(1),
(2) Date: Mar. 28, 2016

(87) PCT Pub. No.: WO2015/049989
PCT Pub. Date: Apr. 9, 2015

(65) Prior Publication Data
US 2016/0233098 A1   Aug. 11, 2016

(30) Foreign Application Priority Data
Oct. 2, 2013   (JP) .................. 2013-207669

(51) Int. Cl.
*H01L 21/285* (2006.01)
*C23C 16/18* (2006.01)
(Continued)

(52) U.S. Cl.
CPC .... *H01L 21/28518* (2013.01); *C23C 16/0272* (2013.01); *C23C 16/18* (2013.01);
(Continued)

(58) Field of Classification Search
CPC ......... H01L 21/28518; H01L 21/28052; H01L 21/28097; H01L 21/28556; H01L 21/28562
See application file for complete search history.

(56) References Cited

U.S. PATENT DOCUMENTS 4,507,401 A * 3/1985 Dubois .................... B01J 23/40
  502/232
6,608,212 B1 * 8/2003 Miller .................... C07B 37/04
  548/575
(Continued)

FOREIGN PATENT DOCUMENTS

JP   2005-093732 A   4/2005
JP   2005-109504 A   4/2005
(Continued)

OTHER PUBLICATIONS

International Search Report PCT/JP2014/074628, dated Nov. 4, 2014.
(Continued)

*Primary Examiner* — Jaehwan Oh
(74) *Attorney, Agent, or Firm* — Orrick, Herrington & Sutcliffe, LLP; Joseph Calveruso

(57) ABSTRACT

A method for producing a nickel thin film on a Si substrate by a chemical vapor deposition method, in which the nickel
(Continued)

thin film is formed by use of a hydrocarbon-type nickel complex represented by a following formula as a raw material compound, which is a nickel complex in which a cyclopentadienyl group (Cp) or a derivative thereof and a chain or cyclic alkenyl group having 3 to 9 carbon atoms or a derivative thereof are coordinated to nickel and an element other than carbon and hydrogen is not contained in the structure, use of hydrogen as a reaction gas, and use of a film formation pressure of 1 to 150 torr and a film formation temperature of 80 to 250° C. as film formation conditions

[Chem. 1]

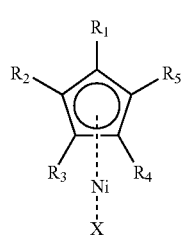

(In the formula, X represents a chain or cyclic alkenyl group having 3 to 9 carbon atoms or a derivative thereof. $R_1$ to $R_5$ which are substituent groups of the cyclopentadienyl group represent $C_nH_{2n+1}$ and n represents an integer of 0 to 6).

5 Claims, 4 Drawing Sheets

(51) Int. Cl.
*C23C 16/56* (2006.01)
*C23C 16/02* (2006.01)
*C23C 16/46* (2006.01)
*C23C 16/42* (2006.01)
*H01L 29/45* (2006.01)

(52) U.S. Cl.
CPC ............. *C23C 16/42* (2013.01); *C23C 16/46* (2013.01); *C23C 16/56* (2013.01); *H01L 21/28556* (2013.01); *H01L 29/456* (2013.01)

(56) References Cited

U.S. PATENT DOCUMENTS

| | | | |
|---|---|---|---|
| 7,968,463 B2* | 6/2011 | Nakagawa | H01L 21/28052 257/E21.165 |
| 9,447,495 B2* | 9/2016 | Suzuki | C23C 16/18 |
| 2005/0059243 A1* | 3/2005 | Machida | H01L 21/28518 438/682 |
| 2006/0223300 A1* | 10/2006 | Simka | C23C 16/18 438/618 |
| 2007/0043188 A1* | 2/2007 | Schaubroeck | B01J 31/2273 526/283 |
| 2008/0242059 A1 | 10/2008 | McSwiney et al. | |
| 2008/0248648 A1* | 10/2008 | Thompson | C07F 17/00 438/681 |
| 2012/0244701 A1 | 9/2012 | Higuchi et al. | |
| 2014/0158674 A1* | 6/2014 | Moffatt | B23K 26/0081 219/385 |
| 2014/0206190 A1* | 7/2014 | Li | H01L 29/401 438/683 |
| 2016/0115587 A1* | 4/2016 | Suzuki | C23C 16/18 427/252 |

FOREIGN PATENT DOCUMENTS

| | | |
|---|---|---|
| JP | 2013-149829 A | 8/2013 |
| WO | WO 2010/032673 | 3/2010 |
| WO | WO 2011-040485 A1 | 9/2010 |

OTHER PUBLICATIONS

Lehmkuhl, H. et al., (η3-Cycloalkenyl) (η5-cyclopentadienyl) nickel-Komplexe, Chem. Ber., Jan. 1984, vol. 117, pp. 376-382.
Schneider, J.J. and Kruger, C., Crystal and Molecular Structure of (Tri-tert-butyl- η5-cyclopentadienly)-(1,2,4-tri-tert-butyl-η3-cyclopentenyl) nickel, Chem. Ber., Apr. 1992, vol. 125, No. 4, p. 843-845.
Extended Search Report for EP appl. No. 14851079.5, dated May 10, 2017.

* cited by examiner

AFTER FORMATION OF Ni FILM
(WITH ACID WASHING)

AFTER SILICIDATION

AFTER FORMATION OF Ni FILM
(WITHOUT ACID WASHING)

AFTER SILICIDATION

METHOD FOR PRODUCING NICKEL THIN FILM ON A SI SUBSTRATE BY CHEMICAL VAPOR DEPOSITION METHOD, AND METHOD FOR PRODUCING NI SILICIDE THIN FILM ON SI SUBSTRATE

TECHNICAL FIELD

The present invention relates to a method for producing a high-quality nickel thin film directly on a Si substrate by a chemical vapor deposition method (chemical vapor phase deposition method (CVD method) or atomic layer deposition method (ALD method)) and a method for producing a Ni silicide thin film by silicidation of the nickel thin film.

BACKGROUND ART

Recently, for lowering the resistance of an electrode material for a semiconductor device such as MOSFET, use of a nickel silicide film (NiSi) that is obtained by silicidation of a nickel thin film is contemplated. A method for formation of a NiSi film generally includes formation of a Ni thin film on a Si substrate and diffusing Si from the Si substrate by heat treatment of the film for silicidation and production of NiSi.

As described above, as a method for producing a Ni thin film to produce a NiSi thin film on a Si substrate, a physical vapor deposition (PVD) method such as sputtering was applied in many cases. However, an application of a chemical vapor deposition method such as a chemical vapor phase deposition method (CVD method) or an atomic layer deposition method (ALD method) currently receives attention. Recently, three-dimensional integration of a semiconductor device is under progress, and a stereo structure is employed for an electrode used for the three-dimensional integration. Additionally, since formation of a thin film with a stereo structure by a PVD method is difficult, application of the chemical vapor deposition method with excellent step coverage is preferable.

A method for producing a Ni film on a Si substrate by chemical vapor deposition in which nickel amidinate is basically used as a precursor (i.e., raw material compound) and $NH_3$ is used as a reaction gas is known (Patent Document 1). The Ni film produced by application of nickel amidinate has nitrogen (N) derived from a raw material or N derived from $NH_3$ as a reaction gas introduced in the film so that nickel nitride ($NiN_x$) is produced in the film. Such impurities are an obstructive factor to low resistance of an electrode, in Patent Document 1, however they are subjected to heat treatment after film formation to remove N. In the aforementioned formation of a Ni thin film and process for increasing the purity, a Ni thin film with high purity, i.e., free of any N component, and low resistance can be finally formed. When this Ni thin film with high purity is formed on a Si substrate, a NiSi film can also be produced.

However, in the method involved with formation of a $NiN_x$ film, a decrease in film density or a change in shape (roughness) of a film occurs in accordance with removal of N, and presence of residual N is also concerned. Accordingly, there is a problem that a Ni thin film having high resistance compared to bulk Ni is yielded. Even when such a Ni thin film is silicidated, a desired electrode cannot be formed.

To form a high-quality Ni thin film with no residual impurities, it will be an appropriate approach to exclude an element like N possibly remaining in a Ni thin film as a constituent element for the precursor and reaction gas. As a preferred condition which may be considered from such point of view, a hydrocarbon-type Ni complex is preferably used as a precursor and hydrogen is employed as a reaction gas, because, with a use of the hydrocarbon-type Ni complex, complex components are released in the form of hydrocarbon so that residual impurities are less likely to be present in a thin film.

RELATED ART DOCUMENT

Patent Document

Patent Document 1: WO 2011/040385 A1

SUMMARY OF THE INVENTION

Problems to be Solved by the Invention

Until now, however, no examples showed that a Ni thin film can be directly produced on Si by use of a hydrocarbon-type Ni complex. As an example for formation of a Ni thin film by use of a hydrocarbon-type Ni complex of a conventional art, the present inventors found that there are several reports related to a Si substrate formed with an oxide film ($SiO_2$) in which a desirable Ni film can be formed. However, in the reports, continuous formation of a Ni thin film is difficult to be achieved for a Si base surface with no oxide film, and this phenomenon is also confirmed in the demonstration tests by the present inventors.

Furthermore, when a Ni film is formed on a Si substrate having an oxide film, NiSi cannot be prepared by silicidation of the Ni film. That is because, as the silicidation progresses by diffusion of Si in the Ni film, if there is an oxide film between the Ni film and the Si substrate, it serves as an obstacle to suppress diffusion of Si into the Ni film. Thus, for formation of a NiSi thin film, formation of a Ni thin film on a Si base surface is necessary.

Accordingly, the present invention provides a method for producing a NiSi film which allows formation of a Ni thin film directly on a Si substrate and can avoid residual impurities on a Ni thin film to be formed. Also, the present invention refers to a method for producing a NiSi film by accurate silicidation of the Ni thin film formed by the aforementioned method.

Means for Solving the Problems

To solve the above problems, the present inventors studied conditions for forming a Ni film directly on a Si substrate while using a hydrocarbon-type Ni complex as a precursor. In the study, the range in which a hydrocarbon-type Ni complex can be used for forming a film directly on Si (i.e., kinds of Ni complex) was examined and also various film formation conditions were determined. Furthermore, it was noted during the study that an occurrence of residual impurities in a Ni thin film is not necessarily always avoided even with a hydrocarbon-type Ni complex. Namely, although the hydrocarbon-type Ni complex less likely to have residual impurities compared to nickel amidinate, there is still a possibility of having carbon (C) incorporated in a Ni film due to the elements constituting the impurities. In the study by the present inventors, the presence of residual carbons in the Ni film (i.e., boundary region between a substrate and Ni film) is also concerned depending on the setting of the film formation conditions. As a result of intensive studies, the present inventors found preferred conditions for forming a Ni thin film on a Si substrate, and the present invention was completed.

Namely, the present invention is a method for producing a nickel thin film on a Si substrate by a chemical vapor deposition method, including the steps of: using a hydrocarbon-type nickel complex represented by a following formula as a raw material compound, which is a nickel complex in which a cyclopentadienyl group (Cp) or a derivative thereof and a chain or cyclic alkenyl group having 3 to 9 carbon atoms or a derivative thereof are coordinated to nickel and an element other than carbon and hydrogen is not contained in the structure; using hydrogen as a reaction gas, and further using a film formation pressure of 1 to 150 torr and a film formation temperature of 80 to 250° C. as film formation conditions

[Chem. 1]

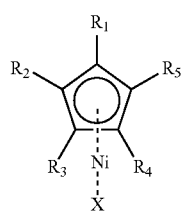

(In the formula, X represents a chain or cyclic alkenyl group having 3 to 9 carbon atoms or a derivative thereof. $R_1$ to $R_5$ which are substituent groups of the cyclopentadienyl group represent $C_nH_{2n+1}$, and n represents an integer of 0 to 6).

Hereinbelow, the present invention is described more specifically. Basic steps of the method for producing a Ni thin film according to the present invention are based on a common chemical vapor deposition method. In the step for producing a thin film by chemical vapor deposition method, a metal complex to be a precursor is vaporized and transported with a reaction gas to a substrate surface and the metal is deposited on a substrate surface from the metal complex. The method for producing a Ni thin film of the present invention is also based on this step, and characterized by defining the type of a precursor and film formation conditions (i.e., film formation pressure and film formation temperature). In the following description, those characteristics are described in detail.

The precursor for producing a Ni thin film in the present invention is a hydrocarbon-type Ni complex which does not contain any elements other than carbon and hydrogen in the structure. This is because it can avoid residual impurities in a Ni film as described above. Furthermore, the hydrocarbon-type Ni complex used in the present invention is the specific hydrocarbon-type Ni complex described above. Among hydrocarbon-type Ni complexes, this Ni complex is used because it has suitable reactivity with hydrogen gas and an excellent vaporization property.

The above hydrocarbon-type Ni complex is a Ni complex coordinated with a cyclopentadienyl group or a derivative thereof and a chain or cyclic alkenyl group or a derivative thereof. Carbon number of the alkenyl group is 3 to 9 in consideration of the vaporization and decomposition property of the Ni complex. A cyclic alkenyl group (cycloalkenyl group) is preferable, and at least one of cyclobutenyl, cyclopentenyl, cyclohexenyl, cycloheptenyl, cyclooctenyl, cyclononenyl and derivatives thereof is particularly preferable. Since the Ni complex coordinated with them can stably vaporize during vaporization step and easily decompose during film formation step at low temperature, it is preferred as a raw material for chemical vapor deposition.

[Chem. 2]

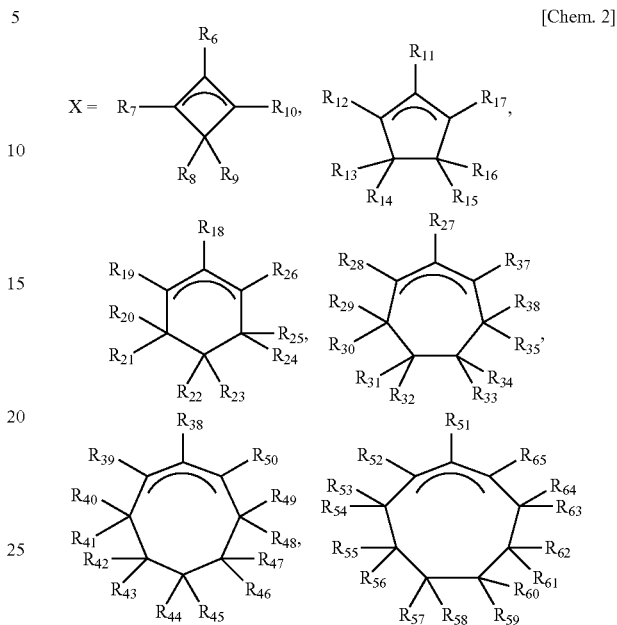

($R_6$ to $R_{65}$ are $C_nH_{2n+1}$, n = 0 to 6. n is an integer.)

Furthermore, the cyclopentadienyl (Cp) as another ligand coordinated to Ni of the Ni complex may be, additionally to the one in which all the substituent groups ($R_1$ to $R_5$) are a hydrogen atom, a derivative in which the substituent group is an alkyl group. Preferred examples of the cyclopentadienyl derivative include a derivative in which one of the substituent groups ($R_1$ to $R_5$) is an alkyl group and the remaining four substituent groups are a hydrogen atom. Furthermore, the substituent groups ($R_1$ to $R_5$) may have carbon number of 0 to 6, preferably 4 or less. If the substituent group of cyclopentadienyl is excessively long, the melt point of an organonickel compound tends to increase or the vapor pressure tends to decrease with the increased molecular weight to yield less vaporization so that impurities are incorporated in a film during film formation, and thus the characteristics that are preferred for a raw material for chemical vapor deposition is difficult to maintain.

For formation of a Ni film by a chemical vapor deposition method, the aforementioned precursor is vaporized and supplied to a Si substrate. At this moment, the vaporized precursor is transported with a reaction gas to a substrate. As a reaction gas, hydrogen is employed to avoid residual impurities in a Ni film.

As a substrate, a Si substrate is used, and may be any one of monocrystal Si and polycrystal Si. A substrate with high purity is preferable. As for the Si substrate, those obtained by removal of an oxide film before Ni film formation are used.

Furthermore, the present inventors found that, by use of the one doped with a suitable amount of any one of B, P, and As on the surface of a Si substrate, a continuous Ni film can be formed at high speed. Although the reason Ni film formation speed is improved by doping with B, P, or As remains unclear, the present inventors believed that a change in substrate surface state promotes adsorption and decomposition of a Ni compound. The dosage of B, P or As is $10^{18}$ atms/cm³ at most, because the film formation speed does not change even when it is more than $10^{18}$ atms/cm³. More preferably, it is $10^{13}$ to $10^{16}$ atms/cm³. The method for doping B, P or As on a Si substrate is not particularly limited, and an ion injection method, a heat diffusion method, or the like can be applied.

With regard to the formation conditions of a Ni film by use of a hydrocarbon-type Ni complex in the present invention, the film formation pressure and film formation temperature are designated. Those film formation conditions are important for formation of a Ni film directly on Si.

The film formation pressure is designated due to the supply amount of a precursor required for film formation. When the film formation pressure is higher than 150 torr, the precursor is difficult to vaporize to yield insufficient supply. Also, when the film formation pressure is lower than 1 torr, insufficient supply is yielded. The preferable film formation pressure is 50 to 120 torr, which easily allows obtainment of continuity and smoothness of a film.

The present inventors also confirmed that the Ni thin film based on a hydrocarbon-type Ni complex is less likely to have residual impurities but the presence of residual carbon is worried as the film formation temperature is increased to high temperature. When the film formation temperature is higher than 250° C., the amount of residual carbon increases. As such, in the present invention, the film formation temperature is set at 80 to 250° C. When the film formation temperature is lower than 80° C., the film formation reaction is difficult to proceed so that a desired film thickness is not easily obtained. The preferred film formation temperature is 100 to 220° C. Meanwhile, the film formation temperature means the temperature for heating a substrate.

Next, a method for producing a Ni silicide (NiSi) thin film according to the present invention is described. Regarding the above step for producing a Ni thin film, high purity and excellent shape are obtained immediately after the step of formation of a film. Furthermore, as the Ni thin film is directly in contact with Si, formation of a NiSi film by silicidation can be easily achieved. The silicidation can be achieved by, under inert gas (preferably, nitrogen or argon) or hydrogen atmosphere, heating a substrate to heat Ni film at 300 to 600° C.

Advantageous Effects of the Invention

According to the present invention, a Ni thin film can be produced while it is directly in contact with Si, which is used as a substrate. The Ni thin film formed by the present invention does not contain impurities such as C, N, and O, and it allows formation of a NiSi film as silicidation can be easily achieved by a suitable heat treatment.

DESCRIPTION OF EMBODIMENTS

Hereinbelow, best modes for carrying out the present invention are described.

First Embodiment: This embodiment was performed to determine the presence or absence of Ni film formation on a Si substrate by use of a hydrocarbon-type Ni complex and silicidation thereof. Here, plural Si substrates with high purity were prepared and each of them was subjected to a film formation test. As for the Si substrate, a Si substrate of which an oxide film has been removed by acid washing and a Si substrate of which an oxide film remains without acid washing were prepared. For acid washing, the substrate was immersed for 5 minutes in dilute hydrofluoric acid (0.5%) to remove an oxide film on the surface.

For film formation test, $(\eta^3$-cyclohexenyl$)(\eta^5$-cyclopentadienyl)nickel(II) was used as a precursor. Furthermore, a film formation device of cold wall type was used, and the nickel thin film was formed by a CVD method. After the film formation test, SEM measurement of a substrate surface was carried out to evaluate the presence or absence of Ni film formation. Film formation conditions are as described below.

Precursor heating temperature: 90° C.
Substrate heating temperature: 200° C.
Carrier gas: argon, 60 sccm
Reaction gas: hydrogen, 100 ccm
Pressure: 100 torr
Film formation time: 20 minutes Next, the obtained Ni thin film was subjected to heat treatment for silicidation. Heat treatment conditions include the substrate temperature was set to 500° C. and the substrate was heated in an atmosphere of 10 sccm hydrogen gas+10 sccm argon. The heating time was 10 minutes in total.

Figure 1:
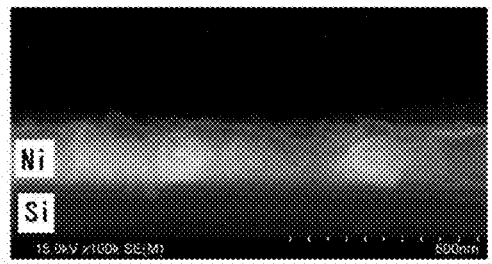
FIG. 1 is a photographic image of the result of Ni film formation and silicidation according to the presence or absence of an oxide film on a Si substrate (first embodiment).
Figure 1:
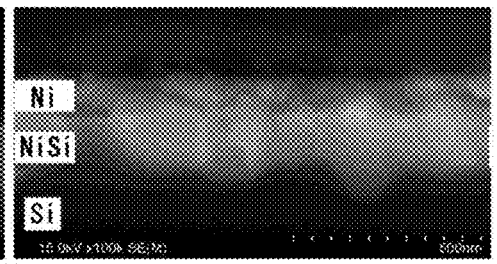
Figure 1:
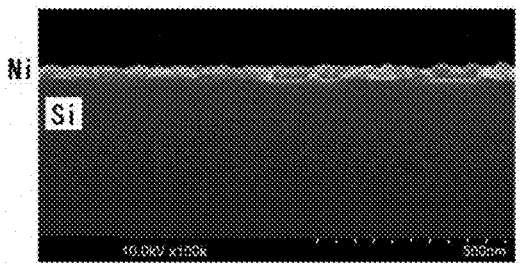
Figure 1:
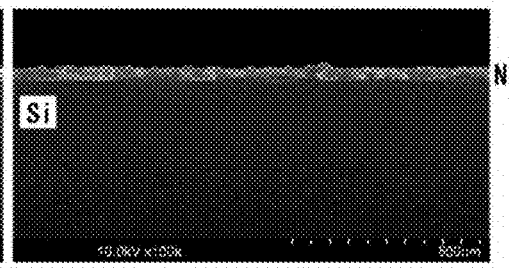

FIG. 1 is a scanning electron micrograph of a Ni thin film on each substrate and a thin film after heat treatment. FIG. 1 shows that the Ni film is formed directly on a Si substrate by the precursor and film formation conditions that are applied for this embodiment. FIG. 1 also shows that, by the heat treatment of the film, silicidation progresses and a SiNi thin film is formed on a Si substrate. Meanwhile, the Ni thin film is also formed on a Si substrate with an oxide film ($SiO_2$). However, no change is seen in the SiNi thin film even after the heat treatment. This is because the $SiO_2$ layer in a boundary between the Ni thin film and the Si substrate functioned as a barrier layer to inhibit diffusion of Si and silicidation was not progressed.

Second embodiment: A Ni thin film was produced while the surface of a Si substrate has been already doped with B. For the B doping on a substrate, B was doped in an amount of $10^{15}$ atms/cm³ by an annealing treatment for 30 minutes at 900° C. after ion injection and acid washing was performed in the same manner as above before film formation. For the film formation test of this embodiment, the same precursor as the first embodiment (($\eta^3$-cyclohexenyl)($\eta^5$-cyclopentadienyl)nickel(II)) was used for formation of a Ni film and the film formation speed was evaluated. Film formation conditions are as described below, and the film thickness of a Ni thin film was measured at film formation time of 1 minute, 2 minutes, 5 minutes, and 15 minutes.

Figure 2:
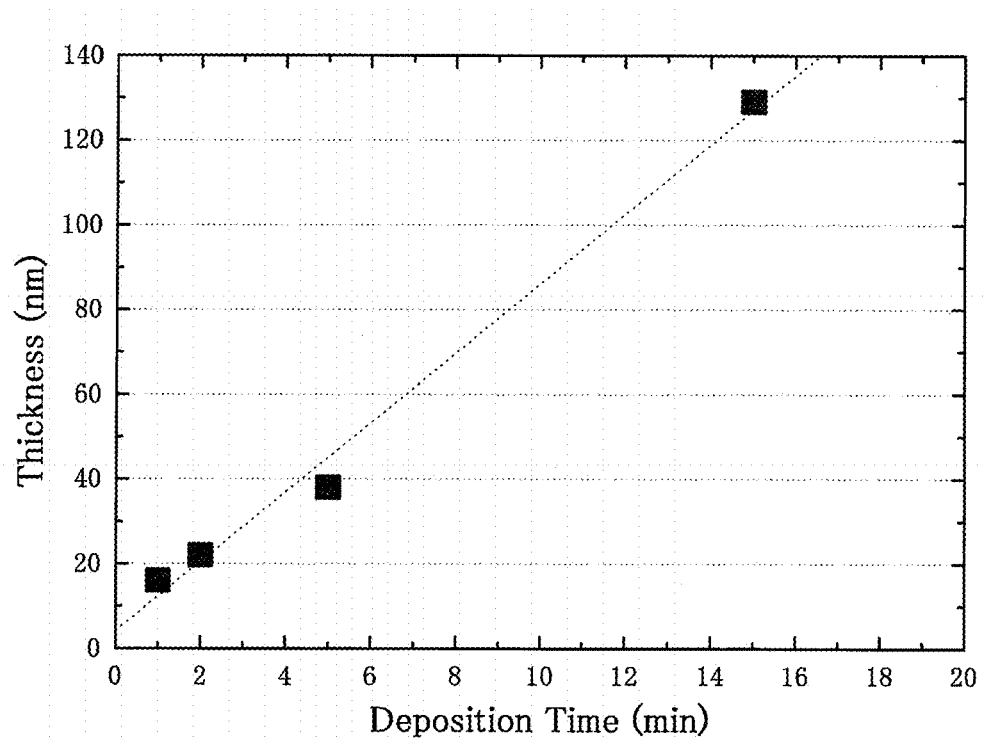
FIG. 2 is a chart illustrating the result of measuring Ni film formation speed on a Si substrate which was doped with B (second embodiment).

Precursor heating temperature: 90° C.
Substrate heating temperature: 175° C.
Carrier gas: argon, 100 sccm
Reaction gas: hydrogen, 100 ccm
Pressure: 100 torr Film formation time: 1 minute, 2 minutes, 5 minutes, and 15 minutes FIG. 2 shows the result of the above film formation test. From FIG. 2, incubation time is hardly seen during the film formation process of a Ni thin film on a B-doped Si substrate and the film starts to grow immediately after start of the film formation. Furthermore, the film thickness increases linearly with film formation time. In this embodiment, relatively good film formation speed of 8.2 nm/min is shown.

Furthermore, the substrate of this embodiment on which a Ni thin film is produced with film formation time of 1 minute or 2 minutes was subjected to heat treatment for silicidation of the Ni thin film on a NiSi thin film. The heat treatment conditions included that the substrate temperature was set to 500° C. and the substrate was heated in an atmosphere of 10 sccm hydrogen gas+10 sccm argon. The heating time was 10 minutes in total.

Figure 3:
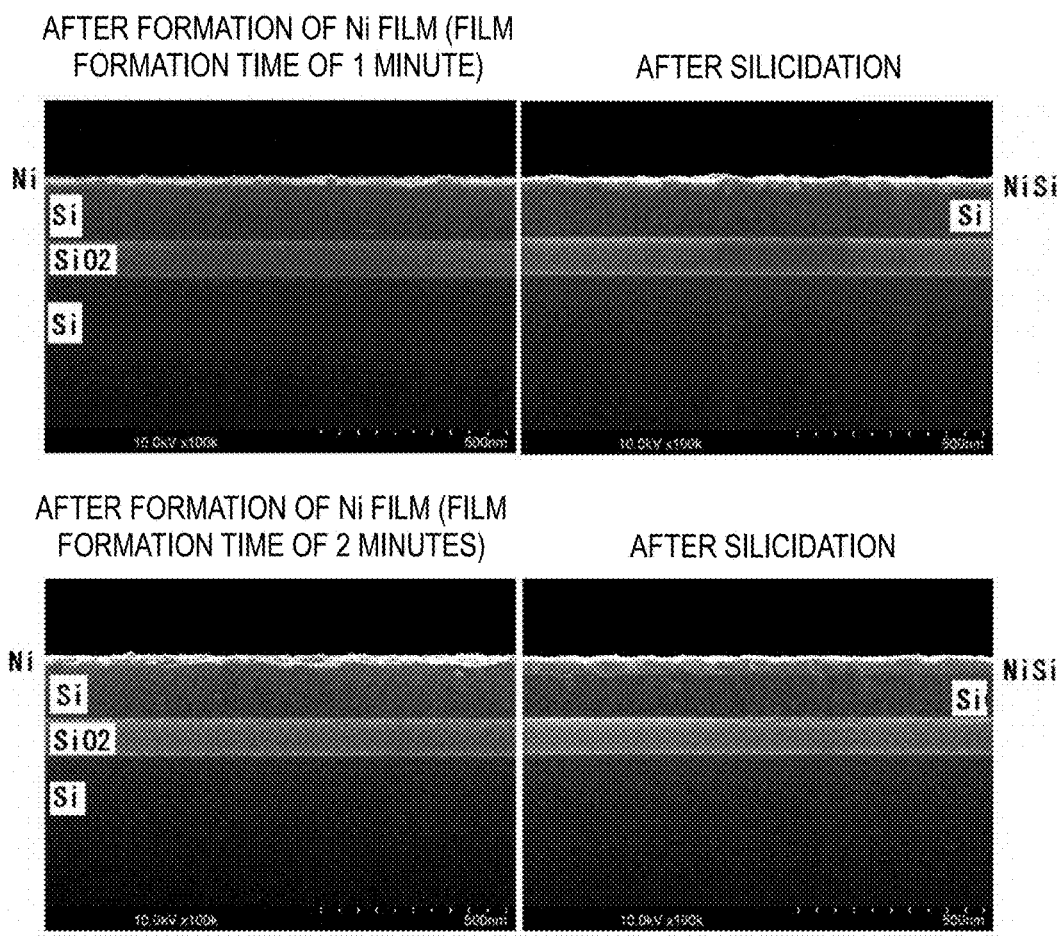
FIG. 3 is a photographic image confirming the silicidation by a heat treatment of the Ni thin film which was formed by the second embodiment.

FIG. 3 is a scanning electron micrograph of each Ni thin film before and after heat treatment. All the Ni thin films have a NiSi thin film formed on top of the film by heat treatment. Even when the Ni thin film is thin (i.e., film formation time of 1 minute), homogeneous silicidation with no unevenness was confirmed.

Figure 4:
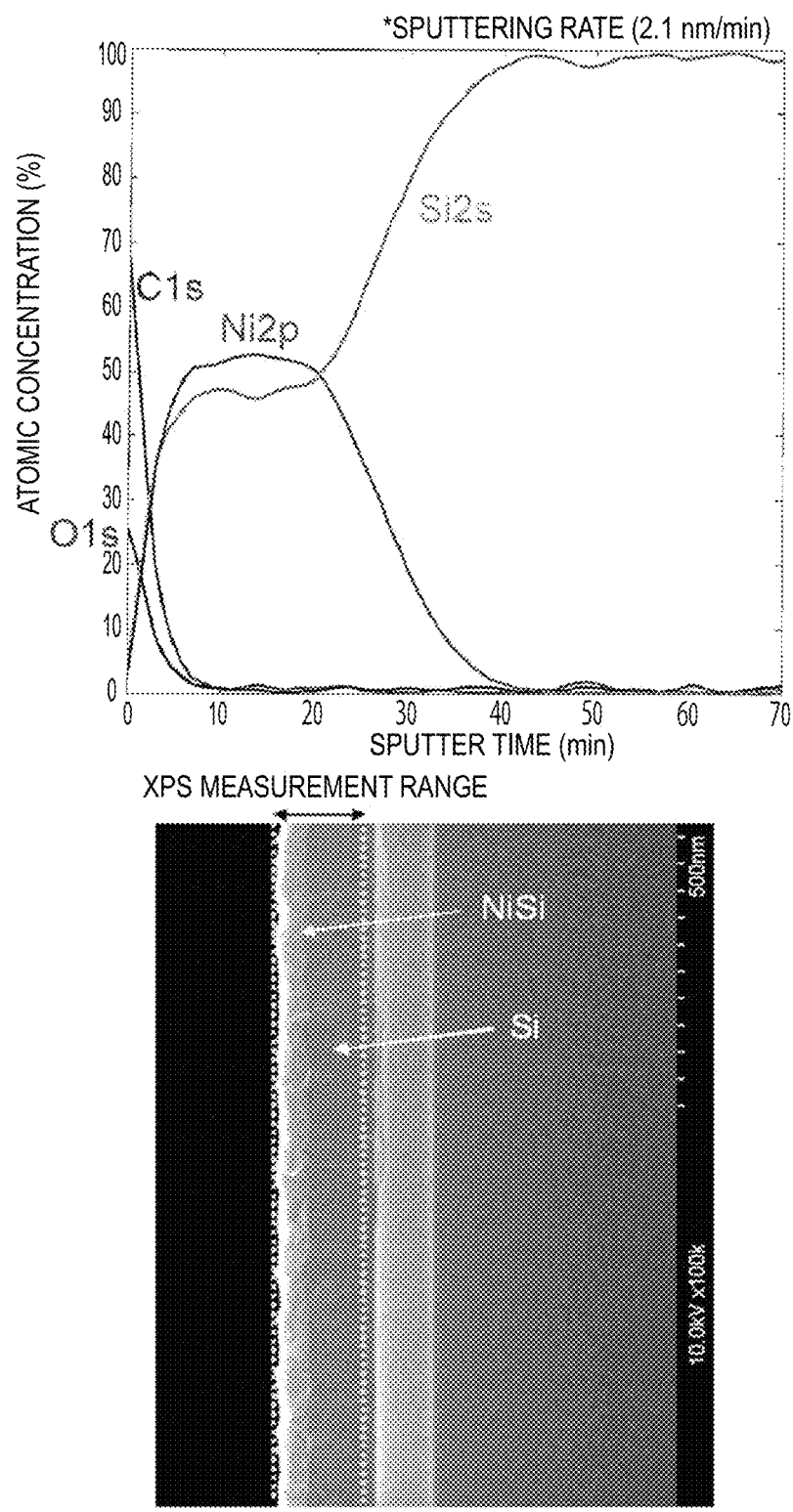
FIG. 4 is a chart illustrating the result of XPS analysis of a cross section of a thin film after silicidation.

Furthermore, a result of XPS analysis of the NiSi thin film (Ni film formation time of 2 minutes) is shown in FIG. 4. From the NiSi thin film formed in this embodiment, no impurity such as C, N, and O was measured. Furthermore, since the compositional ratio between Ni and Si is approximately 1:1, it was confirmed that a Ni silicide thin film with good quality can be obtained.

INDUSTRIAL APPLICABILITY

The method of the present invention allows a Ni thin film to be formed directly on a Si substrate, and in the method, a high-quality Ni thin film without residual impurities such as C, N, or O can be obtained. Furthermore, the Ni thin film can be directly prepared as a NiSi film by heat treatment. The method of the present invention basically includes a process of producing a thin film with excellent step coverage, i.e., chemical vapor deposition method, and is preferably for production of a stereo electrode with three-dimensional structure of various semiconductor devices.

The invention claimed is:

1. A method for producing a nickel thin film on a Si substrate by a chemical vapor deposition method, comprising the steps of:
    using a hydrocarbon-type nickel complex represented by a following formula Chem.1 as a raw material compound, which is a nickel complex in which only two ligands, namely a cyclopentadienyl group (Cp) or a derivative of the cyclopentadienyl group (Cp) and an alkenyl group or a derivative of the alkenyl group represented by a formula Chem.2, which is cyclobutenyl, cyclopentenyl, cyclohexenyl, cycloheptenyl, cyclooctenyl, cyclononenyl, or derivatives thereof, are coordinated to nickel and an element other than carbon and hydrogen is not contained in the structure; using hydrogen as a reaction gas, and further using a film formation pressure of 1 to 150 torr and a film formation temperature of 80 to 250° C. as film formation conditions

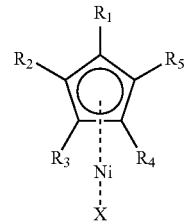

[Chem. 1]

(In the formula, X represents a chain or cyclic alkenyl group having 3 to 9 carbon atoms or a derivative of the alkenyl group. $R_1$ to $R_5$ which are substituent groups of the cyclopentadienyl group represent $C_nH_{2n+1}$, and n represents an integer of 0 to 6)

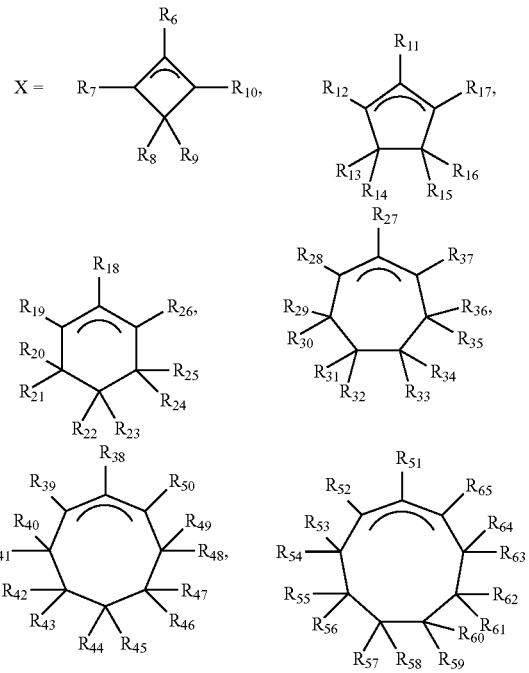

[Chem. 2]

($R_6$ to $R_{65}$ are $C_nC_{2n+1}$, n = 0 to 6. n is a integer).

2. The method for producing a nickel thin film according to claim 1, wherein a Si substrate of which surface is doped with any one of B, P, and As at $10^{13}$ to $10^{18}$ atms/cm$^3$ is used as the Si substrate.

3. A method for producing a Ni silicide thin film, comprising producing a nickel thin film by the method defined in claim 1, and then performing silicidation of the nickel thin film by heating the substrate at 300 to 600° C. in inert gas or hydrogen atmosphere.

4. A method for producing a Ni silicide thin film, comprising producing a nickel thin film by the method defined in claim 2, and then performing silicidation of the nickel thin film by heating the substrate at 300 to 600° C. in inert gas or hydrogen atmosphere.

5. The method according to claim 1, wherein a nickel thin film is produced directly onto an oxide-film-free Si substrate.

* * * * *